US010436831B2

(12) United States Patent
Kang et al.

(10) Patent No.: US 10,436,831 B2
(45) Date of Patent: Oct. 8, 2019

(54) FAULT LOCATION METHOD FOR SERIES-COMPENSATED DOUBLE-CIRCUIT TRANSMISSION LINES

(71) Applicant: ABB Schweiz AG, Baden (CH)

(72) Inventors: Ning Kang, Morrisville, NC (US); Gergely Gombos, Budapest (HU); Mirrasoul J. Mousavi, Cary, NC (US)

(73) Assignee: ABB Schweiz AG, Baden (CH)

( * ) Notice: Subject to any disclaimer, the term of this patent is extended or adjusted under 35 U.S.C. 154(b) by 848 days.

(21) Appl. No.: 14/789,042

(22) Filed: Jul. 1, 2015

(65) Prior Publication Data
US 2017/0003335 A1 Jan. 5, 2017

(51) Int. Cl.
*H03L 7/08* (2006.01)
*G01R 31/08* (2006.01)

(52) U.S. Cl.
CPC ......... *G01R 31/085* (2013.01); *G01R 31/088* (2013.01)

(58) Field of Classification Search
None
See application file for complete search history.

(56) References Cited

U.S. PATENT DOCUMENTS

| 5,455,776 A | 10/1995 | Novosel | |
|---|---|---|---|
| 8,731,853 B2 | 5/2014 | Balcerek et al. | |
| 2011/0082653 A1* | 4/2011 | Balcerek | G01R 31/088 702/59 |
| 2013/0181755 A1* | 7/2013 | Li | H02H 3/283 327/156 |

OTHER PUBLICATIONS

N. Kang and Y. Liao, "Equivalent PI circuit for zero-sequence double circuit transmission lines", in IEEE PES General Meeting, San Diego, California, Jul. 2012, pp. 1-7.
D. Goldsworthy, "A linearized model for MOV-protected series capacitors," IEEE Trans. Power Sys., vol. PWRS-2, No. 4, pp. 953-957, Nov. 2987.
T. Mackawa, Y. Obata, M. Yamaura, Y. Kurosawa, and H. Takani, "Fault location for series compensated parallel lines," in Transmission and Distribution Conference and Exhibition 2002: Asia Pacific, Oct. 2002, pp. 824-829.
V. H. Makwana and B. R. Bhalja, "A new adaptive distance relaying scheme for mutually coupled series-compensated parallel transmission lines during intercircuit faults," IEEE Trans. Power Del., vol. 26, No. 4, pp. 2726-2734, Oct. 2011.
M. M. Saha, J. Izykowski, and E. Rosolowski, "Fault location method using measurements of differential relays for parallel transmission lines with series capacitor compensation at both ends," in 11th International Conference on Developments in Power Systems Protection, Apr. 23-26, 2012, pp. 1-6.

* cited by examiner

*Primary Examiner* — Ali Naraghi
(74) *Attorney, Agent, or Firm* — Taft Stettinius & Hollister LLP; J. Bruce Schelkopf

(57) ABSTRACT

A highly accurate fault location method for series-compensated double-circuit transmission lines having series compensation devices and metal oxide varistors (SC&MOV) at first and second terminal ends is provided. Synchronized or unsynchronized current phasors and local voltage phasors are used as input to the fault location method. The voltages and currents at the fault point are formulated as a function of the unknown fault location. Boundary conditions for the particular IED-determined fault type are used to derive the fault location formulas.

4 Claims, 7 Drawing Sheets

FAULT LOCATION METHOD FOR SERIES-COMPENSATED DOUBLE-CIRCUIT TRANSMISSION LINES

FIELD OF INVENTION

The present application is directed to a highly precise fault location method for series-compensated double-circuit transmission lines and a derivation of synchronization angle for unsynchronized measurements used in the method.

BACKGROUND

Known fault location methods use the lumped parameter line model to approximate power networks for analysis. The lumped parameter line model approximates the parameters of the circuit into ideal components such as resistors, capacitors, and inductors. The lumped parameter line model does not represent a real circuit in which the parameters are distributed uniformly through the length of the line. For example, given the per kilometer (km) impedance (z), admittance (y), and line length (l) in km, the equivalent series impedance for the entire line length under the lumped parameter line model is zl. In contrast, the equivalent series impedance for the entire line length under the distributed parameter line model is $\sqrt{z/y}\sinh(\sqrt{zy}\,l)$.

Further, most known fault location methods for power transmission lines ignore mutual coupling between parallel lines as well as the charging effect of the shunt capacitances of the lines. Additionally, some known fault location methods require source impedances at the two terminal substations and assume constant source impedances, so that these methods are adversely impacted by the varying source impedance.

Utilizing the lumped parameter line model and/or ignoring shunt capacitance causes the accuracy of the fault location algorithm to decrease as the length of the power transmission line increases. Thus, while known fault location methods may be useful for shorter distance transmission lines, there is room for improvement in the accuracy of fault location methods for longer distance power transmission lines.

SUMMARY

A non-transitory computer readable storage medium has thereon a plurality of machine-readable instructions that when executed by at least one computer processor cause the at least one computer processor to perform a method for detecting a fault in series-compensated double-circuit transmission lines between first and second terminals, the plurality of machine-readable instructions having instructions to carry out the following steps:

detecting a fault on a circuit of the transmission lines between the first and second terminals;

determining a fault type for the detected fault;

obtaining synchronized during-fault first terminal voltage measurements and first and second terminal current measurements;

formulating zero, positive, and negative sequence circuits between first and second terminals by distributing as a function of the unknown fault location, m, along the transmission lines, the zero sequence parameters: equivalent mutual series impedance and mutual shunt-admittance of parallel lines between the first terminal and the fault location, equivalent mutual series-impedance and mutual shunt-admittance of parallel lines between the second terminal and the fault location, and the zero, positive and negative sequence parameters: equivalent self-series impedance and self shunt-admittance of the line between the first terminal and the fault location, and equivalent self series-impedance and self shunt-admittance of the line between the second terminal and the fault location;

formulating zero-sequence voltage and negative- and positive-sequence voltage and current at the fault point as a function of unknown fault location, m, as given by:

$$V_f^{(0)} = V_{p1}^{(0)} - \left[I_{p1}^{(0)} - V_{p1}^{(0)}\frac{Y_{pf}^{(0)}}{2} - (V_{p1}^{(0)} - V_{p2}^{(0)})\frac{Y_{1m}^{(0)}}{2}\right]$$

$$Z_{pf}^{(0)} - \left[I_{p2}^{(0)} - V_{p2}^{(0)}\frac{Y_{pf}^{(0)}}{2} - (V_{p2}^{(0)} - V_{p1}^{(0)})\frac{Y_{1m}^{(0)}}{2}\right]Z_{1m}^{(0)} \text{ and}$$

$$V_f^{(i)} = V_{p1}^{(i)} - \left(I_{p1}^{(i)} - V_{p1}^{(i)}\frac{Y_{pf}^{(i)}}{2}\right)Z_{pf}^{(i)} \text{ and}$$

$$I_f^{(i)} = I_{p1}^{(i)}\left(1 + \frac{\frac{Y_{qf}^{(i)}Z_{pf}^{(i)}}{2}}{1+\frac{Y_{qf}^{(i)}Z_{qf}^{(i)}}{2}} + \frac{Y_{pf}^{(i)}+Y_{qf}^{(i)}}{2}Z_{pf}^{(i)}\right) + I_{q1}^{(i)}e^{j\delta}\left(1 - \frac{\frac{Y_{qf}^{(i)}Z_{qf}^{(i)}}{2}}{1+\frac{Y_{qf}^{(i)}Z_{qf}^{(i)}}{2}}\right) -$$

$$V_{p1}^{(i)}\left[\frac{Y_{pf}^{(i)}}{2} + \frac{Y_{qf}^{(i)}}{2}\frac{1+\frac{Y_{pf}^{(i)}Z_{pf}^{(i)}}{2}}{1+\frac{Y_{qf}^{(i)}Z_{qf}^{(i)}}{2}} + \frac{Y_{pf}^{(i)}+Y_{qf}^{(i)}}{2}\left(1+\frac{Y_{pf}^{(i)}Z_{pf}^{(i)}}{2}\right)\right]; \text{ and}$$

determining the fault location distance from the first terminal by the boundary condition for the determined fault type and zero-sequence during-fault voltage at the fault point formulated as a function of the unknown fault location, and positive/negative-sequence during-fault voltage at the fault point and current flowing out of the fault point as a function of the unknown fault location.

A non-transitory computer readable storage medium has thereon a plurality of machine-readable instructions that when executed by at least one computer processor cause the at least one computer processor to perform a method for determining a synchronization angle for use in synchronizing measurements retrieved at first and second terminals of series-compensated double-circuit transmission lines, the plurality of machine-readable instructions having instructions to:

receiving pre-fault first terminal voltage measurement and first and second terminal current measurements;

obtaining positive-sequence equivalent self series-impedance and positive-sequence equivalent self shunt-admittance of the line between first and second terminals;

obtaining voltage and current relationships as expressed below:

$$e^{j\delta} = -\frac{I_{p1}^{(1)0} - V_{p1}^{(1)0}\frac{Y_{pq}^{(1)}}{2} - \left[V_{p1}^{(1)0} - Z_{pq}^{(1)}\left(I_{p1}^{(1)0} - V_{p1}^{(1)0}\frac{Y_{pq}^{(1)}}{2}\right)\right]\frac{Y_{pq}^{(1)}}{2}}{I_{q1}^{(1)0}}$$

using the measurements of positive-sequence pre-fault voltage phasor at the first terminal of the first circuit, positive-sequence pre-fault current phasor at the first terminal of the first circuit, positive-sequence pre-fault current phasor at the second terminal of the first circuit and the line parameters of positive-sequence equivalent self series-impedance and positive-sequence equivalent self shunt-admittance of the line between first and second terminals and synchronization angle; and calculating the synchronization angle from the expression of voltage and current relationships using the measurements of positive-sequence pre-fault voltage phasor at the first terminal of the first circuit, positive-sequence pre-fault current phasor at the first terminal of the first circuit, positive-sequence pre-fault current phasor at the second terminal of the first circuit and the line parameters of positive-sequence equivalent self series-impedance and positive-sequence equivalent self shunt-admittance of the line between first and second terminals.

BRIEF DESCRIPTION OF THE DRAWINGS

In the accompanying drawings, structural embodiments are illustrated that, together with the detailed description provided below, describe exemplary embodiments of a fault location method for series-compensated double-circuit power transmission lines. One of ordinary skill in the art will appreciate that a component may be designed as multiple components or that multiple components may be designed as a single component.

Further, in the accompanying drawings and description that follow, like parts are indicated throughout the drawings and written description with the same reference numerals, respectively. The figures are not drawn to scale and the proportions of certain parts have been exaggerated for convenience of illustration.

DETAILED DESCRIPTION

Figure 1:
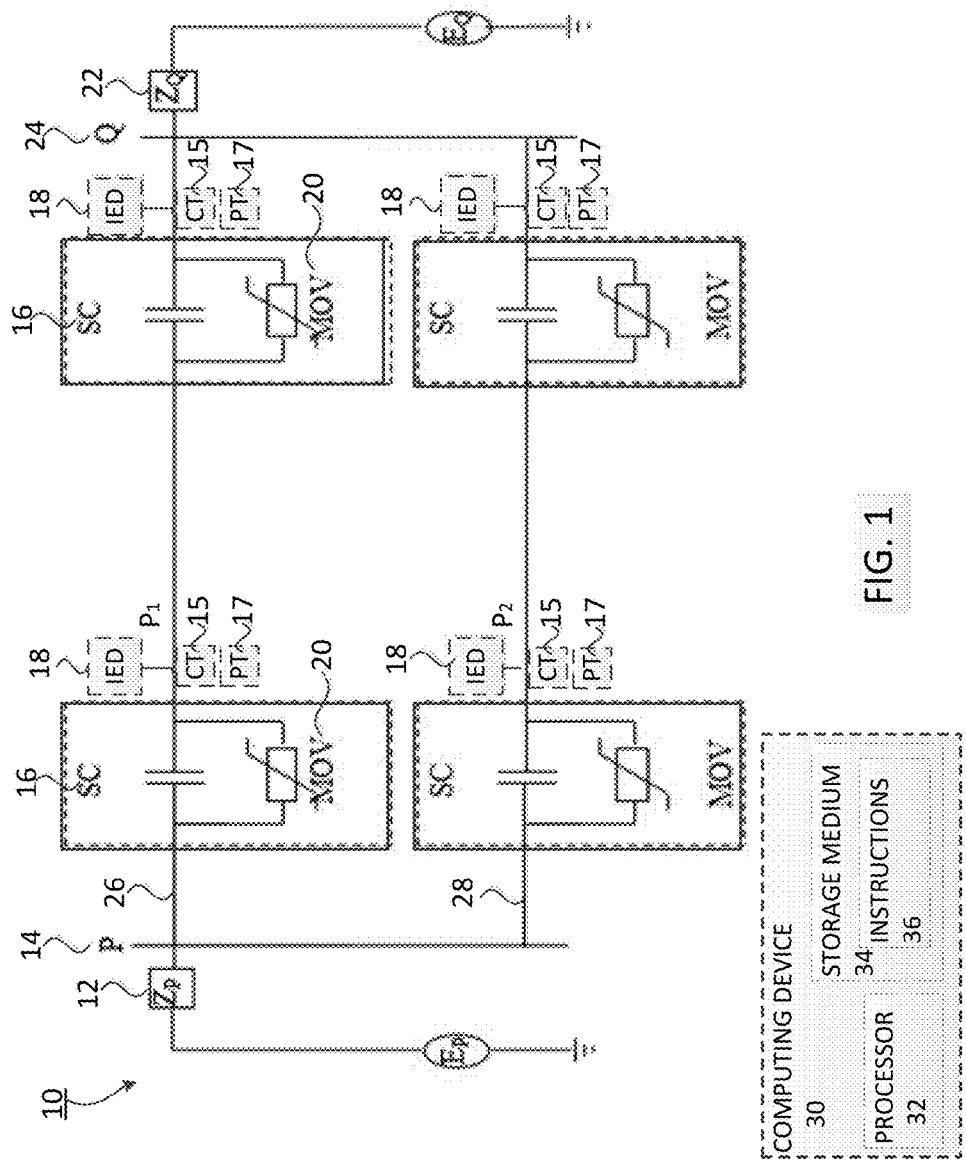
FIG. 1 is a schematic diagram of a series-compensated double-circuit transmission line having intelligent electronic devices (IEDs) for measuring current and voltage on the circuits between first and second terminals.

With reference to FIG. 1, a series compensation (SC) device is installed for long transmission lines to improve power transfer capability and enhance power transmission system 10 stability. The SC device is a capacitor bank or a thyristor-based power flow device that is protected by a metal oxide varistor (MOV) device. As is known, after a fault occurs, it is important to accurately locate the fault so as to quickly repair the faulted component and restore service. The fault location method disclosed herein is based on the distributed parameter line model and is developed for two-end series-compensated double-circuit lines 10 in which each of the circuits 26, 28 may be three-phase circuits. The method is able to accurately consider the mutual coupling between the parallel lines under the zero-sequence network, and fully takes into account the charging effect of the lines and thus does not lose accuracy for long lines. The fault location method utilizes synchronized or unsynchronized two-terminal current phasors and local voltage phasors $P_1$, $P_2$ as inputs.

The voltages and currents at the fault point are formulated in terms of the unknown fault location m. Then, boundary conditions of different fault types are harnessed to derive the fault location formulas as given by Eqs. (28), (30), (32), and (34) which will be described in detail below. A new approach to calculate the synchronization angle using pre-fault quantities is disclosed for the scenario that the two-terminal measurements are not synchronized. It is assumed that the fault impedance is purely resistive and the system is transposed.

The fault type may be known from the intelligent electronic devices (IEDs) such as relays or other protective devices installed at the terminals of the transmission lines in a substation. The fault type may be determined by comparing three phase and zero-sequence during-fault current phasor magnitudes with a pre-set threshold, which is a well-established method. IEDs are fed from current and voltage transformers installed on the first and second circuits 26, 28 between the first and second terminals 14, 24. A fault locator may be located at the first and/or second terminals 14, 24 to receive the information about the type of fault and time-stamp of the fault occurrence. The fault location method does not require the availability of the two-terminal substation impedances and is not impacted by the fault impedance.

A schematic diagram of a series-compensated double-circuit transmission line is shown in FIG. 1. In one embodiment, the series capacitors 16 are capacitor banks that are installed at first and second terminal ends P, Q of the transmission lines. The first and second terminal ends of the series-compensated transmission lines may be located at various points along the transmission lines. Alternatively, the first and second terminals may each be substations at the ends of the transmission lines. The transmission lines between first and second terminals often span hundreds of miles or more.

A metal oxide varistor (MOV) 20, equipped in parallel with a series compensation device (SC) 16, will conduct when an overvoltage across the series capacitor is detected. Suppose there are voltage transformers 17 installed on the right side of the series compensators from terminal P of FIG. 1. The voltage phasors are then directly available at points $P_1$ and $P_2$ and the two-terminal current phasors are available from current transformers 15 installed at both the healthy and faulty circuits of two terminals. $Z_P$ and $Z_Q$ are the equivalent source impedances at first and second terminals 12, 22.

The voltage and current measurements are retrieved from the IEDs installed at the respective substation upon the detection of a fault. These measurements are communicated back to the control room computer having a fault location application installed thereon. The fault location application is deployed upon the detection of a fault by the relay or other protective device. The control room computer has access to the line parameters and upon receiving the voltage and current measurements at first and second terminals 14, 24 (points P and Q in the present example), executes the fault location application and outputs the fault location estimate for crew dispatch.

In some examples, non-transitory computer readable storage media 34 may have embodied thereon a plurality of machine-readable instructions 36 that when executed by at least one computer processor 32 cause the at least one computer processor 32 of the computing device 30 to perform a method for identifying a fault location in a poly-phase power network having double-circuit transmission lines 26, 28. The plurality of machine-readable instructions may include instructions to receive at least one current and/or voltage measurement measured during a fault by an intelligent electronic device (IED), current transformer 15 or voltage transformer 17 disposed within the power network, instructions to calculate a synchronization angle for unsynchronized measurements, instructions to determine voltage and current phasors from voltage and current measurements, instructions to obtain self series-impedance and self shunt-admittance of each line and mutual series-impedance and mutual shunt-admittance of the parallel lines, and instructions to determine during-fault voltage and during-fault current flowing out of the fault point.

In one embodiment, the fault location application is an executable application stored on the substation computer. One example of a trigger for the fault location application is when a relay on the power transmission system being measured is tripped, signaling there is a fault. The voltage and current measurements are transmitted to the substation computer, and the fault location application uses the measurements in the equations described herein to calculate and provide the fault location on a power transmission system as output to the substation computer, mobile devices of the utility crew, IEDs installed on the transmission system of interest, fault locators, or any other medium or device that is capable of communicating or displaying the fault location. The communication of the fault location to the utility crew through an electronic device or other means allows the utility crew to respond to the fault quickly.

Definitions of parameters used in the present disclosure are as follows:

P,Q First and second terminals of the series-compensated transmission line;
F Fault point;
S The point corresponding to the fault point on the healthy circuit;
i Symmetrical component index; i=0, 1, 2 for zero-, positive- and negative-sequence, respectively;
m Unknown fault location in p.u. from bus P to F;
l Total length of the transmission line in km;
δ Synchronization angle between P and Q with P as the reference;
x Parallel line indicator; x=1, 2 for each of the parallel lines;
$V_{px}^{(i)}$ $i^{th}$ sequence during-fault voltage phasor at P of line x;
$V_{px}^{(1)0}$ Positive-sequence pre-fault voltage phasor at P of line x;
$V_{qx}^{(i)}$ $i^{th}$ sequence during-fault voltage phasor at Q of line x;
$V_{qx}^{(1)0}$ Positive-sequence pre-fault voltage phasor at Q of line x;
$I_{px}^{(i)}$ $i^{th}$ sequence during-fault current phasor at P of line x;
$I_{px}^{(1)0}$ Positive-sequence pre-fault current phasor at P of line x;
$I_{qx}^{(i)}$ $i^{th}$ sequence during-fault current phasor at Q of line x;
$I_{qx}^{(1)0}$ Positive-sequence pre-fault current phasor at Q of line x;
$V_f^{(i)}$ $i^{th}$ sequence during-fault voltage at fault point;
$I_f^{(i)}$ $i^{th}$ sequence fault current flowing out of the fault point;
$I_{pf}^{(i)}$ The contribution of fault current from P under $i^{th}$ sequence network;
$I_{qf}^{(i)}$ The contribution of fault current from Q under $i^{th}$ sequence network;
$z^{(i)}, y^{(i)}$ $i^{th}$ sequence self series-impedance and self shunt-admittance of the line per km, respectively;
$z_m^{(0)}, y_m^{(0)}$ Zero-sequence mutual series-impedance and mutual shunt-admittance between the parallel lines per km, respectively;
$Z_{pf}^{(i)}, Y_{pf}^{(i)}$ $i^{th}$ sequence equivalent self series-impedance and self shunt-admittance of the line between P and F, respectively;
$Z_{qf}^{(i)}, Y_{qf}^{(i)}$ $i^{th}$ sequence equivalent self series-impedance and self shunt-admittance of the line between Q and F, respectively;
$Z_{pq}^{(1)}, Y_{pq}^{(1)}$ Positive-sequence equivalent self series-impedance and self shunt-admittance of the line between P and Q, respectively;
$Z_{1m}^{(0)}, Y_{1m}^{(0)}$ zero-sequence equivalent mutual series-impedance and mutual shunt-admittance of the parallel lines between P and F, respectively;
$Z_{2m}^{(0)}, Y_{2m}^{(0)}$ Zero-sequence equivalent mutual series-impedance and mutual shunt-admittance of the parallel lines between Q and F, respectively;
$Z_{cm1}$ Zero-sequence mode-1 characteristic impedance of the double-circuit line;
$Z_{cm2}$ Zero-sequence mode-2 characteristic impedance of the double-circuit line;
$\gamma_{m1}$ Zero-sequence mode-1 propagation constant of the double-circuit line; and
$\gamma_{m2}$ Zero-sequence mode-2 propagation constant of the double circuit line.
$Z_c$ Positive-sequence characteristic impedance of the double-circuit line; and
$\gamma$ Positive-sequence propagation constant of the double circuit line.

Sequence circuits are used to model the double-circuit transmission lines in the present disclosure. The original double-circuit transmission lines contain two parallel three-phase transmission lines. In general, utilizing the symmetrical component transformation matrix, the original three-phase circuit is decoupled into three independent single-phase positive-, negative-, and zero-sequence circuits. For a double-circuit line, after decoupling, the original two parallel three-phase transmission lines are represented by two parallel single-phase lines in each sequence network. In a zero-sequence network, there is a mutual coupling between the two parallel lines. For positive- and negative-sequence networks, there is no mutual coupling between the parallel lines.

Figure 2:
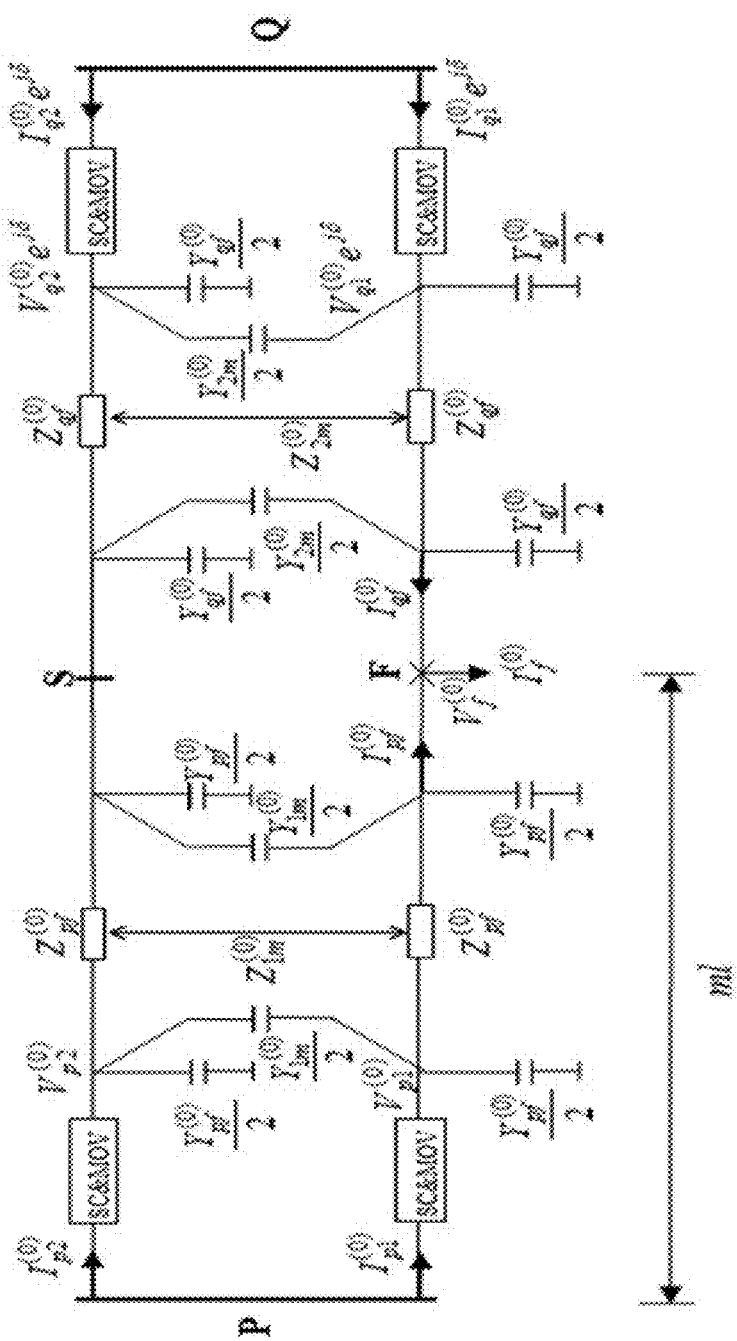
FIG. 2 is a schematic of a zero-sequence model of a series-compensated double-circuit line with a fault.

A schematic diagram of the zero-sequence series-compensated double-circuit line with a fault is shown in FIG. 2. Since the synchronization angle is δ, then all of the unsynchronized measured phasors at Q need to be multiplied by $e^{j\delta}$ to compensate for the angle difference, i.e. $V_{q1}^{(i)}$ becomes $V_{q1}^{(i)}e^{j\delta}$. The parameters in FIG. 2 are calculated as follows:

The zero-sequence equivalent self series-impedance of line between terminal P and the fault point F, is calculated as follows using Eq. (1):

$$Z_{pf}^{(0)} = \frac{1}{2}[Z_{cm2}\sinh(\gamma_{m2}ml) + Z_{cm1}\sinh(\gamma_{m1}ml)] \quad (1)$$

The zero-sequence equivalent mutual series-impedance of the parallel lines between P and F, respectively, is calculated using Eq. (2):

$$Z_{1m}^{(0)} = \frac{1}{2}[Z_{cm2}\sinh(\gamma_{m2}ml) - Z_{cm1}\sinh(\gamma_{m1}ml)] \quad (2)$$

The zero-sequence equivalent self shunt-admittance of the line between terminal P and fault point F is calculated using Eq. (3):

$$Y_{pf}^{(0)} = \frac{2\tanh(\gamma_{m2}ml/2)}{Z_{cm2}} \quad (3)$$

The zero-sequence mutual shunt-admittance of the parallel lines between terminal P and fault point F is calculated using Eq. (4):

$$Y_{1m}^{(0)} = \frac{\tanh(\gamma_{m1}ml/2)}{Z_{cm1}} - \frac{\tanh(\gamma_{m2}ml/2)}{Z_{cm2}} \quad (4)$$

The zero-sequence equivalent self series-impedance of the line between terminal Q and fault point F is calculated using Eq. (5):

$$Z_{qf}^{(0)} = \frac{1}{2}\{Z_{cm2}\sinh[\gamma_{m2}(l-ml)] + Z_{cm1}\sinh[\gamma_{m1}(l-ml)]\} \quad (5)$$

The zero-sequence equivalent mutual series-impedance of the parallel lines between terminal Q and F, is calculated using Eq. (6):

$$Z_{2m}^{(0)} = \frac{1}{2}\{Z_{cm2}\sinh[\gamma_{m2}(l-ml)] - Z_{cm1}\sinh[\gamma_{m1}(l-ml)]\} \quad (6)$$

The zero-sequence equivalent self shunt-admittance of the line between terminal Q and fault point F, is calculated using Eq. (7):

$$Y_{qf}^{(0)} = \frac{2\tanh[\gamma_{m2}(l-ml)/2]}{Z_{cm2}} \quad (7)$$

The zero-sequence equivalent mutual shunt-admittance of the parallel lines between terminal Q and fault point F is calculated using Eq. (8):

$$Y_{2m}^{(0)} = \frac{\tanh[\gamma_{m1}(l-ml)/2]}{Z_{cm1}} - \frac{\tanh[\gamma_{m2}(l-ml)/2]}{Z_{cm2}} \quad (8)$$

where the mode-1 characteristic impedance of the double-circuit line is given by $Z_{cm1}=\sqrt{(z^{(0)}-z_m^{(0)})/(y^{(0)}+2y_m^{(0)})}$; the mode-2 characteristic impedance of the double-circuit line is given by $Z_{cm2}=\sqrt{(z^{(0)}+z_m^{(0)})/y^{(0)}}$; the mode-1 propagation constant of the double-circuit line is given by $\gamma_{m1}=\sqrt{(z^{(0)}-z_m^{(0)})/(y^{(0)}+2y_m^{(0)})}$; and the mode-2 propagation constant of the double-circuit line is given by $\gamma_{m1}=\sqrt{(z^{(0)}+z_m^{(0)})/y^{(0)}}$.

For the zero-sequence network, the following equation holds for zero-sequence during-fault voltage at the fault point:

$$V_f^{(0)} = V_{p1}^{(0)} - \left[I_{p1}^{(0)} - V_{p1}^{(0)}\frac{Y_{pf}^{(0)}}{2} - (V_{p1}^{(0)} - V_{p2}^{(0)})\frac{Y_{1m}^{(0)}}{2}\right] \quad (9)$$
$$Z_{pf}^{(0)} - \left[I_{p2}^{(0)} - V_{p2}^{(0)}\frac{Y_{pf}^{(0)}}{2} - (V_{p2}^{(0)} - V_{p1}^{(0)})\frac{Y_{1m}^{(0)}}{2}\right]Z_{1m}^{(0)}$$

From Eq. (9), the expression of $V_f^{(0)}$ is obtained in terms of $I_{p1}^{(0)}$, $I_{p2}^{(0)}$, $V_{p1}^{(0)}$, $V_{p2}^{(0)}$ and the an unknown distance to fault location m.

Figure 3:
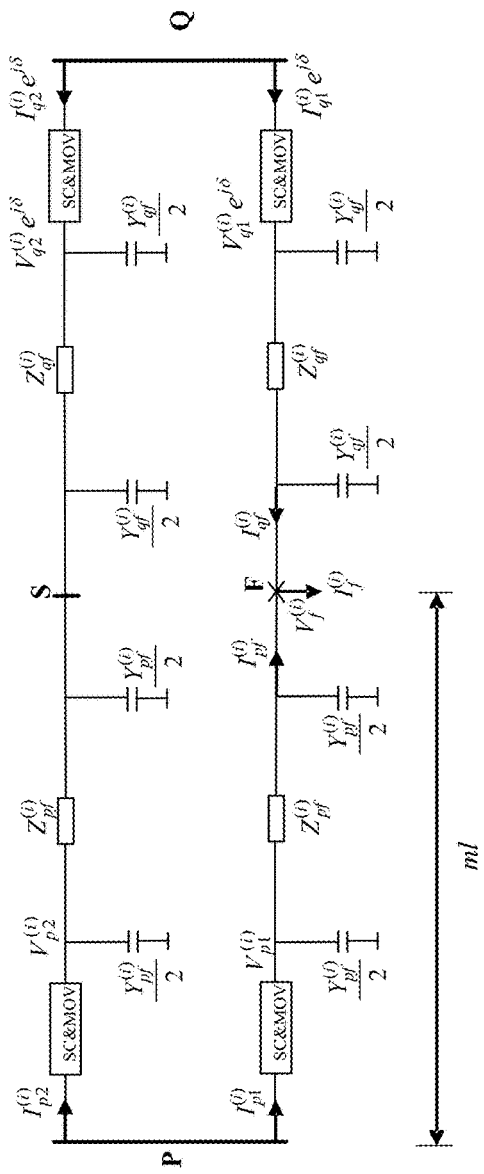
FIG. 3 is a schematic of a positive/negative-sequence model of a series-compensated double-circuit line with a fault.

With reference now to FIG. 3, a schematic diagram of a positive- or negative-sequence series-compensated double-circuit line with a fault is shown. The parameters in of FIG. 3 are calculated as described below. The positive- or negative-sequence equivalent self series-impedance of the line between terminal P and fault point F is calculated using Eq. (10):

$$Z_{pf}^{(i)} = Z_c \sinh(\gamma ml) \quad (10)$$

The positive- or negative-sequence equivalent self shunt-admittance of the line between terminal P and fault point F is calculated using Eq. (11):

$$Y_{pf}^{(i)} = \frac{2\tanh(\gamma ml/2)}{Z_c} \quad (11)$$

The positive- or negative-sequence equivalent self series-impedance of the line between terminal Q and fault point F is calculated using Eq. (12):

$$Z_{qf}^{(i)} = Z_c \sinh[\gamma(l-ml)] \quad (12)$$

The positive- or negative-sequence equivalent self shunt-admittance of the line between terminal Q and fault point F is calculated using Eq. (13):

$$Y_{qf}^{(i)} = \frac{2\tanh[\gamma(l-ml)/2]}{Z_c} \quad (13)$$

Where the characteristic impedance is given by $Z_c=\sqrt{z^{(i)}/y^{(i)}}$ the propagation constant is given by $\gamma=\sqrt{z^{(i)}y^{(i)}}$ and i=1, 2.

The following Eqs. (14), (15), (16) are derived for the positive- or negative-sequence network:

$$V_{p1}^{(i)} - V_f^{(i)} = \left(I_{p1}^{(i)} - V_{p1}^{(i)}\frac{Y_{pf}^{(i)}}{2}\right)Z_{pf}^{(i)} \quad (14)$$

$$V_{q1}^{(i)}e^{j\delta} - V_f^{(i)} = \left(I_{q1}^{(i)}e^{j\delta} - V_{q1}^{(i)}e^{j\delta}\frac{Y_{qf}^{(i)}}{2}\right)Z_{qf}^{(i)} \quad (15)$$

$$I_{p1}^{(i)} - V_{p1}^{(i)}\frac{Y_{pf}^{(i)}}{2} - V_f^{(i)}\frac{Y_{pf}^{(i)}}{2} + I_{q1}^{(i)}e^{j\delta} - V_{q1}^{(i)}e^{j\delta}\frac{Y_{qf}^{(i)}}{2} - V_f^{(i)}\frac{Y_{qf}^{(i)}}{2} = I_f^{(i)} \quad (16)$$

From Eq. (14), the expression of $V_f^{(i)}$, the during-fault voltage at the fault point for the positive- or negative-sequence network is obtained in terms of $I_{p1}^{(i)}$, $V_{p1}^{(i)}$, and m as follows:

$$V_f^{(i)} = V_{p1}^{(i)} - \left(I_{p1}^{(i)} - V_{p1}^{(i)}\frac{Y_{pf}^{(i)}}{2}\right)Z_{pf}^{(i)} \quad (17)$$

Substituting Eq. (17) into Eq. (15) leads to the expression of $V_{q1}^{(i)}$, the positive- or negative-sequence during-fault voltage phasor at Q of line 1, in terms of $I_{p1}^{(i)}$, $I_{q1}^{(i)}$, $V_{p1}^{(i)}$, and m as follows:

$$V_{q1}^{(i)} e^{j\delta} = \frac{V_{p1}^{(i)} - \left(I_{p1}^{(i)} - V_{p1}^{(i)} \frac{Y_{pf}^{(i)}}{2}\right) Z_{pf}^{(i)} + I_{q1}^{(i)} Z_{qf}^{(i)}}{1 + \frac{Y_{qf}^{(i)} Z_{qf}^{(i)}}{2}} \quad (18)$$

Substituting Eqs. (17) and (18) into Eq. (16) leads to the expression of $I_f^{(i)}$, the positive- or negative-sequence fault current flowing out of the fault point, in terms of $I_{p1}^{(i)}$, $I_{q1}^{(i)}$, $V_{p1}^{(i)}$, and m as follows:

$$I_f^{(i)} = \quad (19)$$

$$I_{p1}^{(i)} + I_{q1}^{(i)} e^{j\delta} - V_{p1}^{(i)} \frac{Y_{pf}^{(i)}}{2} - \frac{Y_{qf}^{(i)}}{2} \frac{V_{p1}^{(i)} - \left(I_{p1}^{(i)} - V_{p1}^{(i)} \frac{Y_{pf}^{(i)}}{2}\right) Z_{pf}^{(i)} + I_{q1}^{(i)} e^{j\delta} Z_{qf}^{(i)}}{1 + \frac{Y_{qf}^{(i)} Z_{qf}^{(i)}}{2}} -$$

$$\frac{Y_{pf}^{(i)} + Y_{qf}^{(i)}}{2} \left[V_{p1}^{(i)} - \left(I_{p1}^{(i)} - V_{p1}^{(i)} \frac{Y_{pf}^{(i)}}{2}\right) Z_{pf}^{(i)}\right]$$

Further organizing Eq. (19), the positive- or negative-sequence fault current flowing out of the fault point is obtained using Eq. (20):

$$I_f^{(i)} = \quad (20)$$

$$I_{p1}^{(i)} \left(1 + \frac{\frac{Y_{qf}^{(i)} Z_{pf}^{(i)}}{2} + \frac{Y_{pf}^{(i)} + Y_{qf}^{(i)}}{2} Z_{pf}^{(i)}}{1 + \frac{Y_{qf}^{(i)} Z_{qf}^{(i)}}{2}}\right) + I_{q1}^{(i)} e^{j\delta} \left(1 - \frac{\frac{Y_{qf}^{(i)} Z_{qf}^{(i)}}{2}}{1 + \frac{Y_{qf}^{(i)} Z_{qf}^{(i)}}{2}}\right) -$$

$$V_{p1}^{(i)} \left[\frac{Y_{pf}^{(i)}}{2} + \frac{Y_{qf}^{(i)}}{2} \frac{1 + \frac{Y_{pf}^{(i)} Z_{pf}^{(i)}}{2}}{1 + \frac{Y_{qf}^{(i)} Z_{qf}^{(i)}}{2}} + \frac{Y_{pf}^{(i)} + Y_{qf}^{(i)}}{2} \left(1 + \frac{Y_{pf}^{(i)} Z_{pf}^{(i)}}{2}\right)\right]$$

Figure 4:
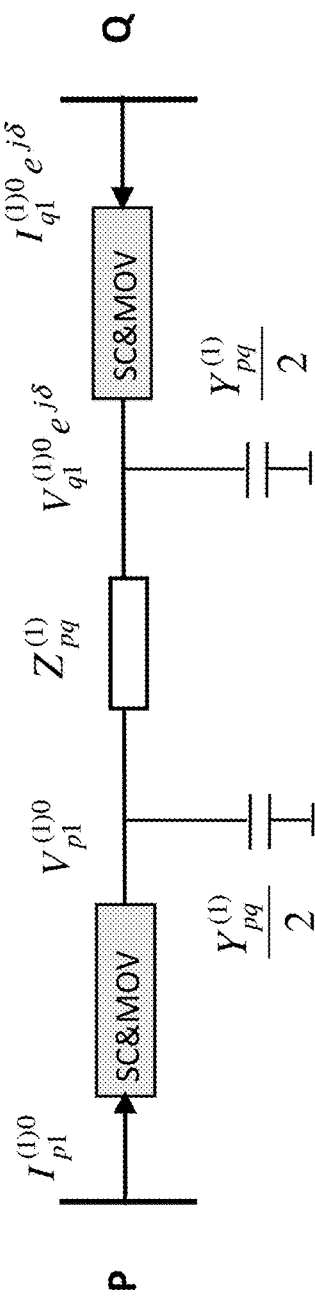
FIG. 4 is a schematic of a pre-fault positive-sequence model of a transmission line.

In accordance with the present disclosure, the synchronization angle is derived using pre-fault measurements, i.e. when no fault is present in the transmission system. A sample series-compensated positive-sequence transmission line without any fault is shown in FIG. 4 to facilitate the derivation of the synchronization angle $\delta$. From the model of the pre-fault positive-sequence transmission line we can write the following two equations:

$$V_{p1}^{(1)0} - V_{q1}^{(1)0} e^{j\delta} = Z_{pq}^{(1)} \left(I_{p1}^{(1)0} - V_{p1}^{(1)0} \frac{Y_{pq}^{(1)}}{2}\right) \quad (21)$$

$$-I_{q1}^{(1)0} e^{j\delta} = I_{p1}^{(1)0} - V_{p1}^{(1)0} \frac{Y_{pq}^{(1)}}{2} - V_{q1}^{(1)0} e^{j\delta} \frac{Y_{pq}^{(1)}}{2} \quad (22)$$

where the positive-sequence shunt-admittance of the line between terminals P and Q is given by:

$$Y_{pq}^{(1)} = \frac{2\tanh(\gamma l/2)}{Z_c^{(1)}}$$

and the positive-sequence series-impedance of the line between terminals P and Q is given by: $Z_{pq}^{(1)} = Z_c \sin h(\gamma l)$.

Substituting $V_{q1}^{(1)0} e^{j\delta}$ from Eq. (21) into Eq. (22) leads to the expression of $e^{j\delta}$ as follows:

$$e^{j\delta} = \frac{I_{p1}^{(1)0} - V_{p1}^{(1)0} \frac{Y_{pq}^{(1)}}{2} - \left[V_{p1}^{(1)0} - Z_{pq}^{(1)} \left(I_{p1}^{(1)0} - V_{p1}^{(1)0} \frac{Y_{pq}^{(1)}}{2}\right)\right] \frac{Y_{pq}^{(1)}}{2}}{I_{q1}^{(1)0}} \quad (23)$$

Eq. (23) demonstrates that $\delta$ can be calculated from the pre-fault two-terminal current phasors at terminals P and Q and the local voltage phasor at terminal P. When the two-terminal measurements at terminals P and Q are synchronized, is equal 0 and there is no need to calculate this quantity.

When potential transformers are not installed on the right side of SC&MOVs, there are no direct voltage measurements available at $P_1$ and $P_2$. However, it is possible to calculate the voltage drop on SC&MOV to arrive at $V_{p1}$ and $V_{p2}$ from the local bus voltage measurement $V_p$ and current measurements $I_{p1}$ and $I_{p2}$. As described by Daniel L. Goldsworthy in "A Linearized Model for MOV-Protected Series Capacitors," IEEE Transactions on Power Systems, Vol. PWRS-2, No. 4, November 1987, a function in Eqs. (24), (25), and (26) for obtaining the equivalent SC&MOV impedance using the current phasors is provided below.

Figure 5:
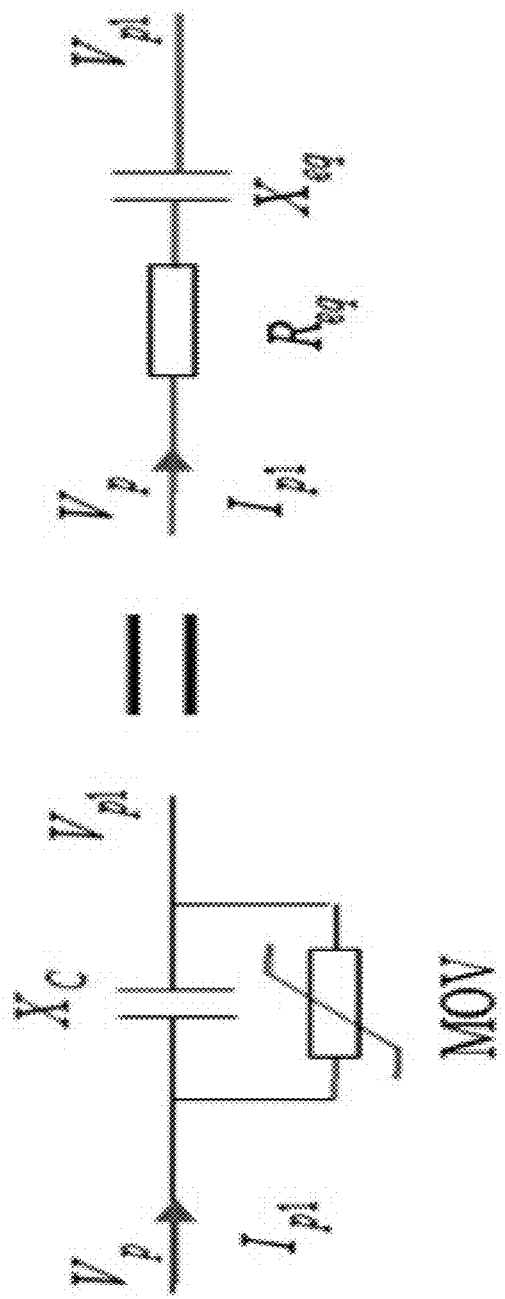
FIG. 5 is an equivalent circuit of a series compensation device and metal oxide varistor (SC&MOV)

Using the single phase voltage $V_{p1}$ as an example, the equivalent SC&MOV resistance $R_{eq}$ and reactance $X_{eq}$ in series in FIG. 5 can be calculated as follows:

$$R_{eq} = \begin{cases} 0 & \text{if } I_{PU} \leq 0.98 \\ X_C(0.0745 + 0.49 \cdot e^{-0.243 I_{PU}} - \\ 35.0 \cdot e^{-5.0 I_{PU}} - 0.6 \cdot e^{-1.4 I_{PU}}) & \text{if } I_{PU} > 0.98 \end{cases} \quad (24)$$

$$X_{eq} = \begin{cases} X_C & \text{if } I_{PU} \leq 0.98 \\ X_C(0.1010 - 0.005749 \cdot I_{PU} + \\ 2.088 \cdot e^{-0.8566 I_{PU}}) & \text{if } I_{PU} > 0.98 \end{cases}$$

where $$I_{PU} = \frac{I_{p1}}{I_{prot}} \quad (25)$$

$I_{PU}$ is the normalized current through SC&MOV with respect to the protection level current $I_{prot}$. $X_c$ is the actual reactance of the installed capacitor bank. The value of $I_{prot}$ in Eq. (25) is estimated using the following formula:

$$V_{peak} = \sqrt{2} I_{prot} X_C \quad (26)$$

where $V_{peak}$ is the instantaneous peak value of the voltage waveform across SC&MOV and is usually 80-90% of $V_{ref}$. Here, $V_{ref}$ is the MOV nameplate reference voltage. The single phase voltage $V_{p1}$ can be calculated from $V_p$, $I_{p1}$, $R_{eq}$ and $X_{eq}$ using $V_{p1} = V_p - I_{p1}(R_{eq} + jX_{eq})$.

The fault location formulas for different types of fault are derived below. The following boundary condition holds for a phase A to ground fault:

$$V_f^{(1)} + V_f^{(2)} + V_f^{(0)} = 3R_f I_f^{(1)} \quad (27)$$

where $V_f^{(1)}$, $V_f^{(2)}$ and $V_f^{(0)}$ can be obtained from Eqs. (17) and (9) and $I_f^{(1)}$ can be obtained from Eq. (20). Since $R_f$ is a real number, it indicates that $(V_f^{(1)} + V_f^{(2)} + V_f^{(0)})$ and $I_f^{(1)}$ are in phase in Eq. (27). The following equation then holds for a phase A to ground fault:

$$\text{Im}\left\{\frac{V_f^{(1)} + V_f^{(2)} + V_f^{(0)}}{I_f^{(1)}}\right\} = 0 \quad (28)$$

where lm(•) yields the imaginary part of the argument. In Eq. (28), the required inputs are two-terminal current phasors and local voltage phasors and the only unknown is the fault location variable m. In one embodiment, the two-terminal current phasors are determined at terminals P and Q and the local voltage phasors are determined at terminal P. The iterative approach is harnessed to pinpoint the fault location. Starting with an initial value of the per unit distance to fault m, the method may utilize the Newton-Raphson technique to iteratively reach a solution for the per unit fault distance m.

For a phase B to phase C fault, the following boundary condition holds:

$$V_f^{(1)} - V_f^{(2)} = R_f I_f^{(1)} \quad (29)$$

Based on Eq. (29), the fault location for a phase B to phase C fault can be calculated from the following formula:

$$\text{Im}\left\{\frac{V_f^{(1)} - V_f^{(2)}}{I_f^{(1)}}\right\} = 0 \quad (30)$$

For a phase B to phase C to ground fault, the following boundary condition is satisfied at the fault point:

$$V_f^{(0)} - V_f^{(1)} = 3R_f I_f^{(0)} \quad (31)$$

where the zero-sequence fault current flowing out of the fault point is given by: $I_f^{(0)} = -(I_f^{(1)} + I_f^{(2)})$. The positive-sequence current flowing out of the fault point, $I_f^{(1)}$, and the negative-sequence current flowing out of the fault point, $I_f^{(2)}$, are obtained from Eq. (20).

Based on Eq. (31), the fault location for a phase B to phase C to ground fault can then be calculated from the following equation:

$$\text{Im}\left\{\frac{V_f^{(0)} - V_f^{(1)}}{I_f^{(0)}}\right\} = 0 \quad (32)$$

For a phase A to phase B to phase C fault, the boundary condition at the fault point is expressed by the following equation:

$$V_f^{(1)} = R_f I_f^{(1)} \quad (33)$$

Utilizing Eqs. (17) and (20), the fault location formula for a phase A to phase B to phase C fault is reached as $$\text{Im}\left\{\frac{V_f^{(1)}}{I_f^{(1)}}\right\} = 0 \quad (34)$$

Fault location formulas for fault types involving other phases can be similarly deduced.

Figure 6:
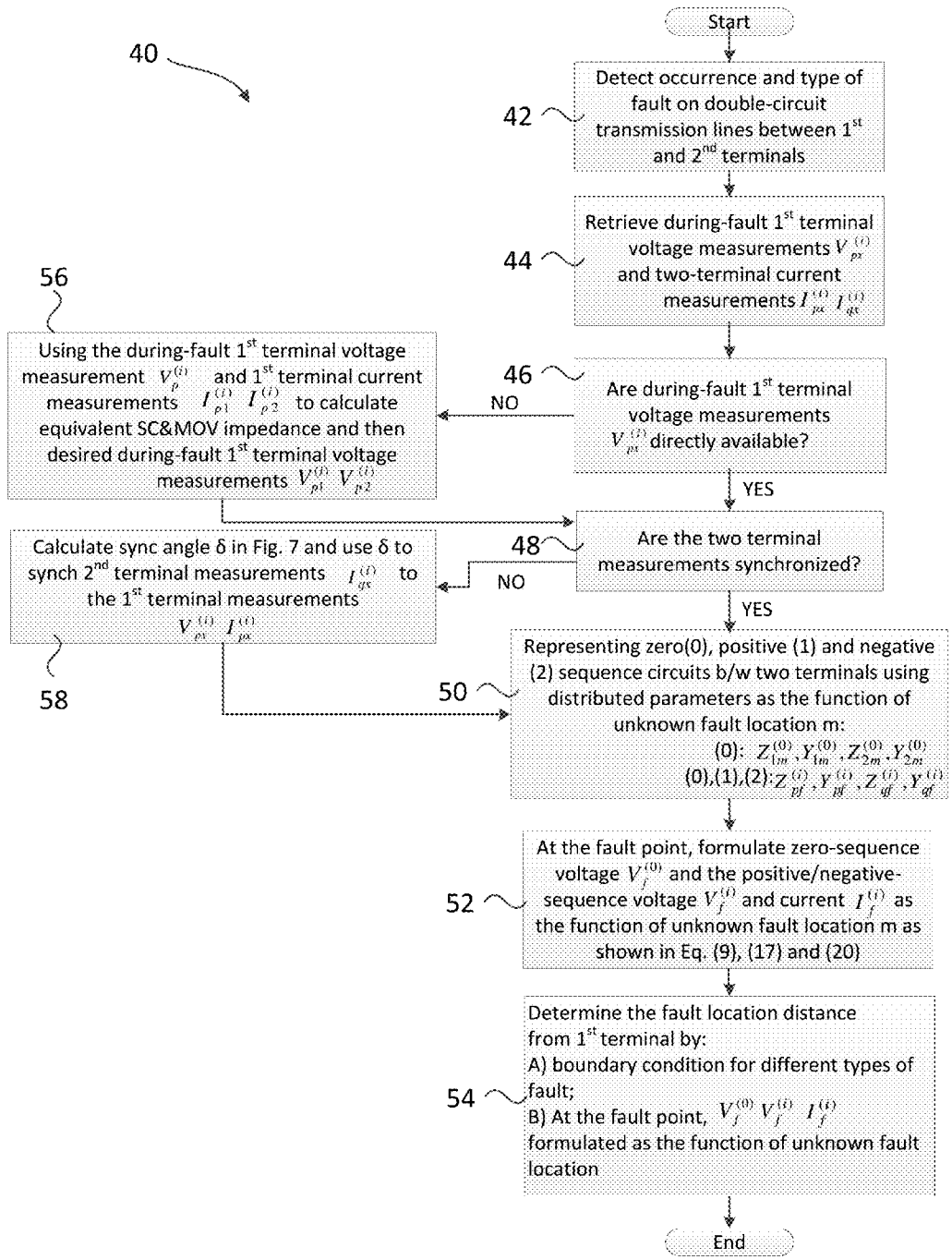
FIG. 6 is flow chart of a fault location method for series-compensated double-circuit transmission lines.

Referring now to FIG. 6, a method for identifying the location of a fault in double-circuit power transmission lines extending between a first terminal and a second terminal 40, and wherein each circuit has a series compensation device and metal oxide varistor (SC&MOV) installed at first and second terminal ends has the following steps. At step 42, a fault is detected on a circuit of the transmission lines between the first and second terminals by an IED or a protective relay and a fault type is determined by the IED for the fault occurrence. At step 44, during-fault first terminal voltage measurements $V_{px}^{(i)}$ and two-terminal current measurements $I_{px}^{(i)}$, $I_{qx}^{(i)}$ are retrieved.

At step 46, it is determined whether during-fault first terminal voltage measurements $V_{px}^{(i)}$ are directly available from the IED. If the during-fault first terminal voltage measurements are not available the Goldsworthy Eqs. (24), (25), and (26) as mentioned above are utilized to determine equivalent SC&MOV impedance and desired during-fault first terminal voltage measurements at step 56.

After obtaining the during-fault first terminal voltage measurements and first and second terminal current measurements, a check is done to determine whether the first and second terminal measurements are synchronized at step 48. If the measurements are not synchronized, at step 58 the synchronization angle is calculated as described in the flow chart of FIG. 7 using the pre-fault first and second terminal current measurements and the first terminal voltage measurement. Further at step 58, the second terminal during-fault current measurements are synchronized to the first terminal during-fault measurements using the calculated synchronization angle.

When the first and second terminal measurements are obtained and synchronized, the zero-, positive-, and negative-sequence circuits between first and second terminals are represented by the distributed parameter line model. In particular, the equivalent zero-sequence parameters and positive- and negative-sequence parameters are formulated as a function of the unknown fault location, m. The zero-sequence parameters include: equivalent mutual series-impedance and mutual shunt-admittance of the parallel lines between the first terminal and the fault location, equivalent mutual series-impedance and mutual shunt-admittance of parallel lines between the second terminal and the fault location. The remaining zero-, positive- and negative-sequence parameters include: equivalent self series-impedance and self shunt-admittance of the line between the first terminal and the fault location, and equivalent self series-impedance and self shunt-admittance of the line between the second terminal and the fault location at step 50.

At step 52, the zero-sequence voltage and negative- and positive-sequence voltage and current at the fault point as a function of unknown fault location, m, are obtained by the following expressions:

$$V_f^{(0)} = V_{p1}^{(0)} - \left[I_{p1}^{(0)} - V_{p1}^{(0)} \frac{Y_{pf}^{(0)}}{2} - (V_{p1}^{(0)} - V_{p2}^{(0)}) \frac{Y_{1m}^{(0)}}{2}\right] Z_{pf}^{(0)} -$$

$$\left[I_{p2}^{(0)} - V_{p2}^{(0)} \frac{Y_{pf}^{(0)}}{2} - (V_{p2}^{(0)} - V_{p1}^{(0)}) \frac{Y_{1m}^{(0)}}{2}\right] Z_{1m}^{(0)}$$

-continued and $$V_f^{(i)} = V_{p1}^{(i)} - \left(I_{p1}^{(i)} - V_{p1}^{(i)}\frac{Y_{pf}^{(i)}}{2}\right)Z_{pf}^{(i)}$$

and $$I_f^{(i)} = I_{p1}^{(i)}\left(1 + \frac{\frac{Y_{qf}^{(i)}Z_{pf}^{(i)}}{2}}{1 + \frac{Y_{qf}^{(i)}Z_{qf}^{(i)}}{2}} + \frac{Y_{pf}^{(i)} + Y_{qf}^{(i)}}{2}Z_{pf}^{(i)}\right) + I_{q1}^{(i)}e^{j\delta}\left(1 - \frac{\frac{Y_{qf}^{(i)}Z_{qf}^{(i)}}{2}}{1 + \frac{Y_{qf}^{(i)}Z_{qf}^{(i)}}{2}}\right) - V_{p1}^{(i)}\left[\frac{Y_{pf}^{(i)}}{2} + \frac{Y_{qf}^{(i)}}{2}\frac{1 + \frac{Y_{pf}^{(i)}Z_{pf}^{(i)}}{2}}{1 + \frac{Y_{qf}^{(i)}Z_{qf}^{(i)}}{2}} + \frac{Y_{pf}^{(i)} + Y_{qf}^{(i)}}{2}\left(1 + \frac{Y_{pf}^{(i)}Z_{pf}^{(i)}}{2}\right)\right]$$

The fault location distance from the first terminal is then determined at step 54 using the boundary condition for the determined fault type and zero-sequence during-fault voltage at the fault point formulated as a function of the unknown fault location, and positive/negative-sequence during-fault voltage at the fault point and current flowing out of the fault point as a function of the unknown fault location.

Figure 7:
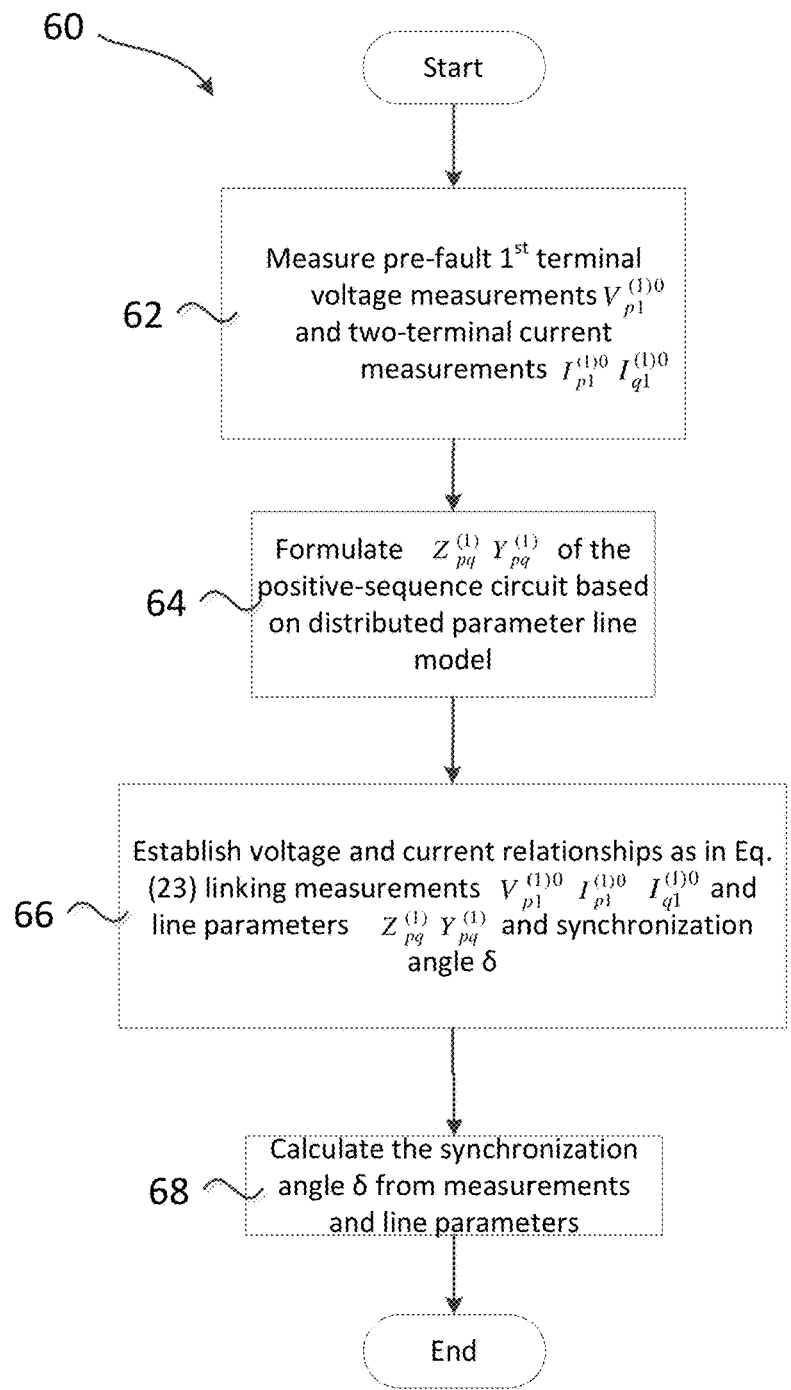
FIG. 7 is a flow chart of a method for the derivation of the synchronization angle.

With reference now to FIG. 7, when the first and second terminal current and voltage measurements are not synchronized, the method for deriving a synchronization angle 60 has the following steps. A pre-fault first terminal voltage measurement and first and second terminal current measurements are received at step 62. The positive-sequence equivalent self series-impedance and positive-sequence equivalent self shunt-admittance of the line between first and second terminals is obtained at step 64. A voltage and current relationship is derived as expressed below:

$$e^{j\delta} = \frac{I_{p1}^{(1)0} - V_{p1}^{(1)0}\frac{Y_{pq}^{(1)}}{2} - \left[V_{p1}^{(1)0} - Z_{pq}^{(1)}\left(I_{p1}^{(1)0} - V_{p1}^{(1)0}\frac{Y_{pq}^{(1)}}{2}\right)\right]\frac{Y_{pq}^{(1)}}{2}}{I_{q1}^{(1)0}}$$

linking the measurements of positive-sequence pre-fault voltage phasor at the first terminal of the first circuit, positive-sequence pre-fault current phasor at the first terminal of the first circuit, positive-sequence pre-fault current phasor at the second terminal of the first circuit and the line parameters of positive-sequence equivalent self series-impedance and positive-sequence self shunt-admittance of the line between first and second terminals and synchronization angle at step 66. At step 68, the synchronization angle is calculated from the expression of voltage and current relationships using the measurements of positive-sequence pre-fault voltage phasor at the first terminal of the first circuit, positive-sequence pre-fault current phasor at the first terminal of the first circuit, positive-sequence pre-fault current phasor at the second terminal of the first circuit and the line parameters of positive-sequence equivalent self series-impedance and positive-sequence self shunt-admittance of the line between first and second terminals.

Simulation results for evaluating the fault location method 40 and synchronization angle derivation method 60 of the present disclosure were obtained using Matlab SimPowerSystems. The series-compensated double-circuit line was simulated, and voltage and current phasors were generated for faults of different types, locations and resistances. These phasors were fed into the algorithm to produce the fault location estimate. The initial value for the iterative fault location estimation process is chosen as 0.5 p.u. or 0.5 per unit length in km. The accuracy of fault location estimate is evaluated by percentage error defined as:

$$\% \text{ Error} = \frac{|\text{Actual Location} - \text{Estimated Location}|}{\text{Total Length of Faulted Line}} \times 100 \quad (35)$$

The sample power system studied is a 500 KV, 1000 MVA, 50 Hz double-circuit transmission line compensated at the degree of 45%. The total length of the line is 350 km, with the series compensation devices installed at two ends of the transmission lines. The synchronization angle is set to π/8 (22.5°). Other data are listed in Table I and Table II.

TABLE I

Voltage Source Data

| Quantity | Source P | Source Q |
|---|---|---|
| Emf(p.u.) | 1.0∠20° | 1.0∠0° |
| Pos. Seq. Imp. (Ω) | 17.177 + j45.5285 | 15.31 + j45.9245 |
| Zero. Seq. Imp. (Ω) | 2.5904 + j14.7328 | 0.7229 + j15.1288 |

TABLE II

Transmission Line Data

| Parameters | Pos. Seq | Zero. Seq | Zero. Seq Mutual |
|---|---|---|---|
| R(Ω/km) | 0.061 | 0.268 | 0.12 |
| L(mH/km) | 1.1182 | 3.3012 | 1.1485 |
| C(nF/km) | 14.8332 | 8.6001 | −0.6761 |

In one embodiment, the MOV has thirty columns of metal-oxide discs connected in parallel inside the same porcelain housing. The characteristics of each column is represented by a combination of the following three exponential functions:

$$\frac{V}{V_{ref}} = k_i\left(\frac{I}{I_{ref}}\right)^{1/\alpha_i} \quad (36)$$

where
$V_{ref}$=165 kV, $I_{ref}$=1 kA, i=1, 2, 3.
The parameters of the three segments of (36) are:
$k_1$=0.955, $\alpha_1$=50
$k_2$=1.0, $\alpha_2$=25
$k_3$=0.9915, $\alpha_3$=16.5

The fault location results are summarized in Table III, Table IV and Table V. The first two columns display the actual fault type and fault resistance simulated. The remaining columns present the percentage fault location error under various actual fault locations. Under the assumption that the voltage measurements on the right side of SC&MOV are directly available, Table III and Table IV deliver the results when the terminals are synchronized and when the terminals have a 22.5° synchronization angle, respectively. Table V reports the results when the two terminal measurements have a 22.5° synchronization angle and the voltage measurements are not directly available on the right side of SC&MOV.

TABLE III

Fault Location Result - Synchronized, no voltage estimation

| Fault Type | Fault Resistance (Ω) | Fault Location Error (%) | | | | |
|---|---|---|---|---|---|---|
| | | 60 km | 120 km | 180 km | 260 km | 320 km |
| AG | 1 | 0.0176 | 0.0421 | 0.0769 | 0.1816 | 0.2871 |
| | 10 | 0.0178 | 0.0432 | 0.0760 | 0.1823 | 0.2899 |
| | 50 | 0.0178 | 0.0413 | 0.0748 | 0.1852 | 0.2843 |
| BC | 1 | 0.0098 | 0.0459 | 0.0925 | 0.1575 | 0.6018 |
| | 10 | 0.0098 | 0.0459 | 0.0922 | 0.1575 | 0.6021 |
| | 50 | 0.0099 | 0.0467 | 0.0910 | 0.1578 | 0.6013 |
| BCG | 1 | 0.0590 | 0.0657 | 0.3203 | 0.4736 | 0.0024 |
| | 10 | 0.0590 | 0.0651 | 0.3189 | 0.4724 | 0.0059 |
| | 50 | 0.0584 | 0.0619 | 0.3113 | 0.4688 | 0.0199 |
| ABC | 1 | 0.0242 | 0.0437 | 0.0481 | 0.2299 | 0.4124 |
| | 10 | 0.0242 | 0.0459 | 0.0482 | 0.2296 | 0.4171 |
| | 50 | 0.0250 | 0.0481 | 0.0497 | 0.2282 | 0.4163 |

TABLE IV

Fault Location Result - 22.5° Sync Angle, no voltage estimation

| Fault Type | Fault Resistance (Ω) | Fault Location Error (%) | | | | |
|---|---|---|---|---|---|---|
| | | 60 km | 120 km | 180 km | 260 km | 320 km |
| AG | 1 | 0.0176 | 0.0421 | 0.0768 | 0.1816 | 0.2872 |
| | 10 | 0.0178 | 0.0432 | 0.0760 | 0.1823 | 0.2899 |
| | 50 | 0.0178 | 0.0413 | 0.0748 | 0.1850 | 0.2840 |
| BC | 1 | 0.0098 | 0.0459 | 0.0925 | 0.1577 | 0.6024 |
| | 10 | 0.0098 | 0.0459 | 0.0922 | 0.1577 | 0.6027 |
| | 50 | 0.0099 | 0.0467 | 0.0910 | 0.1579 | 0.6016 |
| BCG | 1 | 0.0590 | 0.0657 | 0.3203 | 0.4736 | 0.0024 |
| | 10 | 0.0590 | 0.0651 | 0.3188 | 0.4724 | 0.0058 |
| | 50 | 0.0584 | 0.0619 | 0.3113 | 0.4686 | 0.0195 |
| ABC | 1 | 0.0242 | 0.0437 | 0.0481 | 0.2301 | 0.4128 |
| | 10 | 0.0242 | 0.0459 | 0.0482 | 0.2297 | 0.4174 |
| | 50 | 0.0250 | 0.0481 | 0.0497 | 0.2282 | 0.4163 |

TABLE V

Fault Location Result - 22.5° Sync Angle, with voltage estimation

| Fault Type | Fault Resistance (Ω) | Fault Location Error (%) | | | | |
|---|---|---|---|---|---|---|
| | | 60 km | 120 km | 180 km | 260 km | 320 km |
| AG | 1 | 0.2360 | 0.4311 | 0.1034 | 0.1881 | 0.3141 |
| | 10 | 0.2363 | 0.4321 | 0.1024 | 0.1896 | 0.3182 |
| | 50 | 0.2366 | 0.4300 | 0.1008 | 0.1961 | 0.3171 |
| BC | 1 | 0.2000 | 0.0900 | 0.2392 | 0.4227 | 0.9959 |
| | 10 | 0.2002 | 0.0897 | 0.2374 | 0.4230 | 0.9961 |
| | 50 | 0.2007 | 0.0877 | 0.2296 | 0.4241 | 0.9952 |
| BCG | 1 | 0.3755 | 0.2570 | 0.2473 | 0.4406 | 0.0287 |
| | 10 | 0.3758 | 0.2556 | 0.2463 | 0.4398 | 0.0312 |
| | 50 | 0.3766 | 0.2489 | 0.2397 | 0.4376 | 0.0410 |
| ABC | 1 | 0.2101 | 0.2512 | 0.0015 | 0.3621 | 0.5273 |
| | 10 | 0.2099 | 0.2538 | 0.0002 | 0.3614 | 0.5305 |
| | 50 | 0.2097 | 0.2568 | 0.0062 | 0.3584 | 0.5274 |

From Table III, Table IV and Table V, it can be observed that the fault location results are highly accurate. In all three simulation sets, the highest error is a 10 ohm BC fault, occurring at 320 km from the local terminal. The maximum error is 0.6021% with synchronized measurements, 0.6027% with unsynchronized measurements and 0.9961% when the SC&MOV voltage drop is estimated and the measurements are unsynchronized. The results in Table III and Table IV are quite close, proving the error introduced in estimating the synchronization angle is negligible. The results in Table V indicate slightly less accuracy than the results of Table III and Table IV due to the estimation of the voltage drop across the SC&MOV. However, since the error introduced by the estimation of the voltage drop across the SC&MOV is quite small, the fault location accuracy is still quite good.

As previously mentioned, the fault location method disclosed herein for series-compensated double-circuit transmission lines employs two-terminal synchronized or unsynchronized current phasors and local voltage phasors as input and formulates the voltages and currents at the fault point with respect to the unknown fault location. Then boundary conditions for different fault types are utilized to derive the fault location formulas. Determining the fault location accurately assists the repair crew to pinpoint the faulted component and accelerate service restoration.

In formulating the fault location, the distributed parameter line model for the double-circuit lines is adopted, which is exact because the parameters are distributed uniformly throughout the lines. The distributed parameter line model considers the actual contribution of each parameter, including but not limited to mutual and self series-impedance and mutual and self shunt-admittance, to the overall behavior of the transmission lines rather than approximating a percentage as is done in the lumped parameter line model or ignoring shunt capacitance as in other models. The lumped parameter line model is a good approximation for short and medium length lines and will lose accuracy as the line length increases.

Further, the mutual coupling between the parallel lines under the zero-sequence circuit is considered. The fault location method disclosed herein is more accurate than the methods using an approximate distributed parameter line model, such as a lumped parameter line model, of the zero-sequence circuit because the approximate distributed parameter line model does not consider the exact zero-sequence mutual coupling between the parallel lines. Further, the circuit representation of the transmission lines in a lumped parameter line model is an approximate linear function of the line length as opposed to the equivalent parameters (impedance, capacitance) in the distributed parameter line model which are hyperbolic functions of the line length.

Further, the fault locating method also takes into account the charging effect of the shunt capacitances of the lines and therefore the accuracy of the algorithm does not decrease with the increase of the line length. This overcomes the challenge over algorithms that ignore the shunt capacitances of the lines.

The fault location formulas disclosed herein do not require the knowledge of fault resistance and therefore are not subject to the errors introduced by assuming the fault resistance value. Moreover, the source impedances at the two terminal substations are not required in the fault location formulation and thus the algorithm is free of the impact caused by varying source impedances.

Lastly, the new method to calculate the synchronization angle based on the distributed parameter line model presented herein utilizes pre-fault two terminal current phasors and local voltage phasor. This relaxes the synchronization requirement of the two terminal measurements, which relies on special measuring devices such as PMUs.

It should be appreciated that the power grids including transmission lines span hundreds of miles over varying and complex terrain which presents accessibility issues to a utility crew. Therefore, accurately pinpointing a fault location for communication to the utility crew is important to restore power in a timely fashion so that impact to consumers in the form of outages is minimized. Short-circuit faults are the most common and severe threat to the power transmission lines.

Without the timely, accurate fault location information, the maintenance crew could spend days patrolling the transmission lines in search of the fault. The longer the outage time, the more fragile the grid is before the faulted line is reactivated. This may lead to cascading failures (blackout) impacting millions of customers. The present application discloses a solution for utilities to pinpoint the fault in a timely manner, speed up service restoration, reduce loss of revenues, and improve the reliability of power systems.

While the present application illustrates various embodiments, and while these embodiments have been described in some detail, it is not the intention of the applicant to restrict or in any way limit the scope of the appended claims to such detail. Additional advantages and modifications will readily appear to those skilled in the art. Therefore, the invention, in its broader aspects, is not limited to the specific details, the representative embodiments, and illustrative examples shown and described. Accordingly, departures may be made from such details without departing from the spirit or scope of the applicant's general inventive concept.

What is claimed is:

1. A method for identifying the location of a fault in double-circuit power transmission lines of a power network extending between a first terminal and a second terminal, and wherein each circuit has a series compensation device and metal oxide varistor (SC&MOV) installed at first and second terminal ends, the method comprising:
    detecting a fault occurrence on a circuit of the transmission lines between the first and second terminals;
    determining a fault type for the fault occurrence;
    obtaining, by a substation of the power network, synchronized during-fault first terminal voltage measurements and first and second terminal current measurements from an intelligent electronic device (IED);
    formulating: zero-, positive-, and negative-sequence circuits between the first and second terminals, and which include the SC&MOV at the first and second terminal ends, by distributing as a function of the unknown fault location, m, along the transmission lines, zero-sequence parameters, the formulated zero-sequence circuit being based at least in part by the exact zero-sequence mutual impedance between the parallel lines based a distributed parameter line model:
    an equivalent mutual series impedance and a mutual shunt-admittance of parallel lines between the first terminal and the unknown fault location, an equivalent mutual series-impedance and a mutual shunt-admittance of parallel lines between the second terminal and the unknown fault location, and zero, positive and negative sequence parameters: an equivalent self-series impedance and a self shunt-admittance of the transmission line between the first terminal and the unknown fault location, and an equivalent self series-impedance and a self shunt-admittance of the transmission line between the second terminal and the unknown fault location;
    formulating zero-sequence during-fault voltage and negative- and positive-sequence during-fault voltage and a current at a fault point as a function of the unknown fault location, m, as given by:

$$V_f^{(0)} = V_{p1}^{(0)} - \left[I_{p1}^{(0)} - V_{p1}^{(0)}\frac{Y_{pf}^{(0)}}{2} - (V_{p1}^{(0)} - v_{p2}^{(0)})\frac{Y_{1m}^{(0)}}{2}\right]Z_{pf}^{(0)} -$$
$$\left[I_{p2}^{(0)} - V_{p2}^{(0)}\frac{Y_{pf}^{(0)}}{2} - (V_{p2}^{(0)} - V_{p1}^{(0)})\frac{Y_{1m}^{(0)}}{2}\right]Z_{1m}^{(0)}$$

and $$V_f^{(i)} = V_{p1}^{(i)} - \left(I_{p1}^{(i)} - V_{p1}^{(i)}\frac{Y_{pf}^{(i)}}{2}\right)Z_{pf}^{(i)}$$

and $$I_f^{(i)} = I_{p1}^{(i)}\left(1 + \frac{\frac{Y_{qf}^{(i)}Z_{pf}^{(i)}}{2}}{1 + \frac{Y_{qf}^{(i)}Z_{qf}^{(i)}}{2}} + \frac{Y_{pf}^{(i)} + Y_{qf}^{(i)}}{2}Z_{pf}^{(i)}\right) + I_{q1}^{(i)}e^{j\delta}\left(1 - \frac{\frac{Y_{qf}^{(i)}Z_{qf}^{(i)}}{2}}{1 + \frac{Y_{qf}^{(i)}Z_{qf}^{(i)}}{2}}\right) -$$
$$V_{p1}^{(i)}\left[\frac{Y_{pf}^{(i)}}{2} + \frac{Y_{qf}^{(i)}}{2}\frac{1 + \frac{Y_{pf}^{(i)}Z_{pf}^{(i)}}{2}}{1 + \frac{Y_{qf}^{(i)}Z_{qf}^{(i)}}{2}} + \frac{Y_{pf}^{(i)} + Y_{qf}^{(i)}}{2}\left(1 + \frac{Y_{pf}^{(i)}Z_{pf}^{(i)}}{2}\right)\right];$$

determining a fault location distance from the first terminal by a boundary condition for the determined fault type and the zero-sequence during-fault voltage at the fault point formulated as the function of the unknown fault location, and the negative- and positive-sequence during-fault voltage at the fault point and the current at the fault point as the function of the unknown fault location outputting a control signal, by the substation in electrical communication with the IED, based on the determined fault location distance, the control signal controlling transmission of electrical power over the power network.

2. The method of claim 1 wherein when the first and second terminal current and voltage measurements are not synchronized, a synchronization angle is derived to synchronize the first and second terminal current and voltage measurements, the method having the following steps:
    receiving a pre-fault first terminal voltage measurement and the second terminal current measurements;
    obtaining a positive-sequence equivalent self series-impedance and a positive-sequence equivalent self shunt-admittance of the transmission line between first and second terminals;
    obtaining voltage and current relationships as expressed below:

$$e^{j\delta} = \frac{I_{p1}^{(1)0} - V_{p1}^{(1)0}\frac{Y_{pq}^{(1)}}{2} - \left[V_{p1}^{(1)0} - Z_{pq}^{(1)}\left(I_{p1}^{(1)0} - V_{p1}^{(1)0}\frac{Y_{pq}^{(1)}}{2}\right)\right]\frac{Y_{pq}^{(1)}}{2}}{I_{q1}^{(1)0}}$$

using measurements of: a positive-sequence pre-fault voltage phasor at the first terminal of a first circuit, a positive-sequence pre-fault current phasor at the first terminal of the first circuit, a positive-sequence pre-fault current phasor at the second terminal of the first circuit, and transmission line parameters of a positive-sequence equivalent self series-impedance and a positive-sequence equivalent self shunt-admittance of the transmission line between the first and second terminals and the synchronization angle; and calculating: the synchronization angle from the expression of voltage and current relationships using the measurements of the positive-sequence pre-fault voltage phasor at the first terminal of the first circuit, the positive-sequence pre-fault current phasor at the first terminal of the first circuit, the positive-sequence pre-fault current phasor at the second terminal of the first circuit, and transmission line parameters of the positive-sequence equivalent self series-impedance and the positive-sequence equivalent self shunt-admittance of the transmission line between the first and second terminals.

3. A system for detecting a fault in series-compensated double-circuit transmission lines on a power network, and wherein each circuit has a series compensation device and metal oxide varistor (SC&MOV) installed at a first and second terminal ends, the system comprising:

a non-transitory computer readable storage medium of a substation of the power network having embodied thereon a plurality of machine-readable instructions that when executed by at least one computer processor cause the at least one computer processor to perform a method for detecting a fault in series-compensated double-circuit transmission lines between first and second terminals, the plurality of machine-readable instructions comprising instructions to carry out the following steps:

detecting a fault on a circuit of the transmission lines between the first and second terminals;

determining a fault type for the detected fault;

obtaining synchronized during-fault first terminal voltage measurements and first and second terminal current measurements from an intelligent electronic device (IED) that is in electrical communication with the substation;

formulating: zero, positive, and negative sequence circuits between the first and second terminals, and which include the SC&MOV at the first and second terminal ends, by distributing as a function of the unknown fault location, m, along the transmission lines, zero sequence parameters, the formulated zero-sequence circuit being based at least in part by the exact zero-sequence mutual impedance between the parallel lines based a distributed parameter line model: an equivalent mutual series impedance and a mutual shunt-admittance of parallel lines between the first terminal and the unknown fault location, an equivalent mutual series-impedance and a mutual shunt-admittance of parallel lines between the second terminal and the unknown fault location, and zero, positive and negative sequence parameters: an equivalent self-series impedance and a self shunt-admittance of the transmission line between the first terminal and the unknown fault location, and an equivalent self series-impedance and a self shunt-admittance of the transmission line between the second terminal and the unknown fault location;

formulating zero-sequence during-fault voltage and negative- and positive-sequence during-fault voltage and a current at a fault point as a function of the unknown fault location, m, as given by:

$$V_f^{(0)} = V_{p1}^{(0)} - \left[I_{p1}^{(0)} - V_{p1}^{(0)}\frac{Y_{pf}^{(0)}}{2} - (V_{p1}^{(0)} - V_{p2}^{(0)})\frac{Y_{1m}^{(0)}}{2}\right]Z_{pf}^{(0)} - \left[I_{p2}^{(0)} - V_{p2}^{(0)}\frac{Y_{pf}^{(0)}}{2} - (V_{p2}^{(0)} - v_{p1}^{(0)})\frac{Y_{1m}^{(0)}}{2}\right]Z_{1m}^{(0)}$$

and $$V_f^{(i)} = V_{p1}^{(i)} - \left(I_{p1}^{(i)} - V_{p1}^{(i)}\frac{Y_{pf}^{(i)}}{2}\right)Z_{pf}^{(i)}$$

and $$I_f^{(i)} = I_{p1}^{(i)}\left(1 + \frac{\frac{Y_{qf}^{(i)}Z_{pf}^{(i)}}{2}}{1+\frac{Y_{qf}^{(i)}Z_{qf}^{(i)}}{2}} + \frac{Y_{pf}^{(i)}+Y_{qf}^{(i)}}{2}Z_{pf}^{(i)}\right) + I_{q1}^{(i)}e^{j\delta}\left(1 - \frac{\frac{Y_{qf}^{(i)}Z_{qf}^{(i)}}{2}}{1+\frac{Y_{qf}^{(i)}Z_{qf}^{(i)}}{2}}\right) - V_{p1}^{(i)}\left[\frac{Y_{pf}^{(i)}}{2} + \frac{Y_{qf}^{(i)}}{2}\frac{1+\frac{Y_{pf}^{(i)}Z_{pf}^{(i)}}{2}}{1+\frac{Y_{qf}^{(i)}Z_{qf}^{(i)}}{2}} + \frac{Y_{pf}^{(i)}+Y_{qf}^{(i)}}{2}\left(1 + \frac{Y_{pf}^{(i)}Z_{pf}^{(i)}}{2}\right)\right];$$ and determining a fault location distance from the first terminal by a boundary condition for the determined fault type and the zero-sequence during-fault voltage at the fault point formulated as the function of the unknown fault location, and the positive/negative-sequence during-fault voltage at the fault point and the current of the fault point as the function of the unknown fault location;

wherein the substation is configured to output a control signal based on the determined fault location distance, the control signal controlling transmission of electrical power over the power network.

4. A system for detecting a fault in series-compensated double-circuit transmission lines on a power network, and wherein each circuit has a series compensation device and metal oxide varistor (SC&MOV) installed at a first and a second terminal ends, the system comprising:

a non-transitory computer readable storage medium of a substation of the power network having embodied thereon a plurality of machine-readable instructions that when executed by at least one computer processor cause the at least one computer processor to perform a method for determining a synchronization angle for use in synchronizing measurements retrieved at first and second terminals of series-compensated double-circuit transmission lines, the plurality of machine-readable instructions comprising instructions to:

receive a pre-fault first terminal voltage measurement and first and second terminal current measurements from an intelligent electronic device (TED) that is in electrical communication with the substation;

obtain a positive-sequence equivalent self series-impedance and a positive-sequence equivalent self shunt-admittance of the transmission line between first and second terminals, and which include the SC&MOV at the first and the second terminal ends, obtain voltage and current relationships as expressed below:

$$e^{j\delta} = -\frac{I_{p1}^{(1)0} - V_{p1}^{(1)0}\frac{Y_{pq}^{(1)}}{2} - \left[V_{p1}^{(1)0} - Z_{pq}^{(1)}\left(I_{p1}^{(1)0} - V_{p1}^{(1)0}\frac{Y_{pq}^{(1)}}{2}\right)\right]\frac{Y_{pq}^{(1)}}{2}}{I_{q1}^{(1)0}}$$

using measurements of: a positive-sequence pre-fault voltage phasor at only one of the first terminal and the second terminal of a first circuit, a positive-sequence pre-fault current phasor at the first terminal of the first circuit, a positive-sequence pre-fault current phasor at the second terminal of the first circuit, and transmission line parameters of a positive-sequence equivalent self series-impedance and a positive-sequence equivalent self shunt-admittance of the transmission line between the first and second terminals and the synchronization angle; and calculate: the synchronization angle from the expression of voltage and current relationships using the measurements of the positive-sequence pre-fault voltage phasor at only one of the first terminal and the second terminal of the first circuit, the positive-sequence pre-fault current phasor at the first terminal of the first circuit, the positive-sequence pre-fault current phasor at the second terminal of the first circuit, and transmission line parameters of the positive-sequence equivalent self series-impedance and the positive-sequence equivalent self shunt-admittance of the transmission line between the first and second terminals wherein the substation is configured to output a control signal based at least in part on the calculated synchronization angle, the control signal controlling transmission of electrical power over the power network.

\* \* \* \* \*